United States Patent
Takayuki

(10) Patent No.: US 8,881,380 B2
(45) Date of Patent: Nov. 11, 2014

(54) COMPONENT MOUNTING APPARATUS AND METHOD FOR PHOTOGRAPHING COMPONENT

(75) Inventor: Hatase Takayuki, Changwon (JP)

(73) Assignee: Samsung Techwin Co., Ltd., Changwon (KR)

( * ) Notice: Subject to any disclaimer, the term of this patent is extended or adjusted under 35 U.S.C. 154(b) by 96 days.

(21) Appl. No.: 13/483,520

(22) Filed: May 30, 2012

(65) Prior Publication Data

US 2012/0304459 A1    Dec. 6, 2012

(30) Foreign Application Priority Data

May 31, 2011  (JP) ................... 2011-122144
Oct. 31, 2011  (KR) .......... 10-2011-0112492

(51) Int. Cl.
*B23P 19/00*   (2006.01)
*H05K 13/04*   (2006.01)

(52) U.S. Cl.
CPC .................. *H05K 13/0408* (2013.01)
USPC .............. 29/739; 29/729; 29/700; 29/720; 29/743; 414/752.1; 414/751.1; 414/737; 294/183; 294/186; 294/188; 356/635; 356/638; 356/621; 356/603; 356/614; 359/260; 483/1; 483/16; 483/9

(58) Field of Classification Search
USPC ......... 29/739, 729, 700, 720, 743; 414/752.1, 414/751.1, 737; 294/183, 186, 188; 356/635, 638, 621, 603, 614; 359/260; 483/1, 16, 9
See application file for complete search history.

(56) References Cited

U.S. PATENT DOCUMENTS 7,540,922 B2 *  6/2009  Okada et al. .................. 118/665
2007/0003126 A1 *  1/2007  Case et al. .................... 382/141

* cited by examiner

*Primary Examiner* — Peter DungBa Vo
*Assistant Examiner* — Azm Parvez
(74) *Attorney, Agent, or Firm* — Sughrue Mion, PLLC

(57) ABSTRACT

There is provided a component mounting apparatus, which includes: a nozzle which sucks a component; a nozzle supporting member, on which the nozzle is installed, which moves in a vertical direction with respect to an upper surface of a substrate on which the component sucked at the nozzle is mounted; an optical system which captures an image of a leading edge portion of the nozzle where the component is sucked in a component mounting operation, from a side direction, such that an optical axis of the optical system is inclined at a predetermined angle with respect to a sucking surface of the nozzle; and an analyzer which analyzes the image of the leading edge portion to determine whether a sucking state of the component sucked by the nozzle is normal or abnormal.

9 Claims, 6 Drawing Sheets

COMPONENT MOUNTING APPARATUS AND METHOD FOR PHOTOGRAPHING COMPONENT

CROSS-REFERENCE TO RELATED PATENT APPLICATIONS

This application claims priority from Japanese Patent Application No. 2011-122144, filed on May 31, 2011, in the Japan Patent Office, and Korean Patent Application No. 10-2011-00112492, filed on Oct. 31, 2011, in the Korean Intellectual Property Office, the disclosures of which are incorporated herein in their entirety by reference.

BACKGROUND

1. Field

Apparatuses consistent with exemplary embodiments relate to mounting an electronic component such as an integrated circuit (IC) chip on a printed substrate.

2. Description of the Related Art

To begin with, for the convenience of description of the present application, a component mounting apparatus will be referred to as a mounting apparatus, and a component mounted by the mounting apparatus includes an electronic component.

In general, a mounting apparatus sucks a component from a component supplying portion by using a nozzle, and mounts the component on a predetermined location on a substrate such as a printed circuit board (PCB).

In the mounting apparatus, a leading edge portion of the sucking nozzle is photographed after sucking a component and before mounting the component on the substrate to identify through an image whether the component is sucked by the nozzle and/or a sucking state of the component, in order to prevent, in advance, a defective component from being mounted, misalignment of the component, mounting failure. In addition, in order to identify that the component is properly detached from the nozzle and mounted on the substrate, the leading edge portion of the nozzle is photographed again after the mounting process to recognize the existence of the component through an image.

As a photographing unit for photographing the leading edge portion of the nozzle, a side photographing unit for illuminating and photographing the leading edge portion of the suck nozzle from a side direction is known.

As disclosed in Japanese Laid-open Patent Publications Nos. 1998-78309, 2004-349346, and 2006-41158, a related-art side photographing unit illuminates and photographs the leading edge portion of a nozzle in a horizontal direction.

An optical system in the side photographing unit is installed on a nozzle supporting member with the nozzle, and the optical system of the side photographing unit is fixed on the nozzle supporting member while the nozzle may be elevated in an up-and-down direction. That is, an optical axis of the optical system of the related-art side photographing unit is in the horizontal direction.

In the configuration where the optical axis of the optical system is in the horizontal direction, when a sucked state of the component with respect to the nozzle is checked before mounting the component, the nozzle has to be moved in an up-and-down direction to nearly the same height as the optical axis of the optical system in order to photograph the component sucked by the nozzle. On the other hand, when the component is mounted, since other components that are mounted already are located on the substrate, a lower end portion of the optical system has to be disposed higher than a maximum height of the other components in order to avoid interference with the other components for the above checking operation by the optical system.

The moving distance of the nozzle in the up-and-down direction needs to be reduced in order to perform the mounting process at a high speed and improve a mounting accuracy. However, there is a limitation in reducing the moving amount of the nozzle in the related-art mounting apparatus. A height of the component may be reduced in order to reduce the moving distance; however, in this case, there may be a defect in the specifications of the mounting apparatus.

SUMMARY

One or more exemplary embodiments provide a component mounting apparatus capable of reducing a moving distance of a nozzle which sucks a component in an up-and-down direction in order to perform a component mounting process at a high speed and improve a mounting accuracy. One or more exemplary embodiments also provide a method of determining a sucking state of the component sucked by a nozzle of the component mounting apparatus.

According to an aspect of an exemplary embodiment, there is provided a component mounting apparatus, which may include: a nozzle which sucks a component; a nozzle supporting member, on which the nozzle is installed, which moves in a vertical direction with respect to an upper surface of a substrate on which the component sucked at the nozzle is mounted; an optical system which captures an image of a leading edge portion of the nozzle where the component is sucked in a component mounting operation, from a side direction, such that an optical axis of the optical system is inclined at a predetermined angle with respect to a sucking surface of the nozzle; and an analyzer which analyzes the image of the leading edge portion to determine whether a sucking state of the component sucked by the nozzle is normal or abnormal.

The optical axis of the optical system is inclined at an angle predetermined between 4° and 40° upward with respect to the sucking surface of the nozzle, which is a horizontal surface.

The component mounting apparatus may further include: a pixel rate storage which stores pixel rate data which is obtained by capturing an image of the component when the component is normally sucked by the nozzle prior to the component mounting operation, by using the optical system; and an image corrector which corrects image data of the component in the image of the leading edge portion captured in the component mounting operation, by using the pixel rate data stored in the pixel rate data storage.

According to an aspect of another exemplary embodiment, there is provided a method of determining a sucking state of a component sucked by a nozzle of a component mounting apparatus. The method may include: capturing an image of a leading edge portion of the nozzle where the component is sucked in a component mounting operation, from a side direction of the component mounting apparatus, by using an optical system such that an optical axis of the optical system is inclined at a predetermined angle with respect to a sucking surface of the nozzle; and analyzing the image of the leading edge portion to determine whether a sucking state of the component sucked by the nozzle is normal or abnormal.

The optical axis of the optical system is inclined at an angle ranging from 4° to 40° upward with respect to the sucking surface of the nozzle, which is a horizontal surface.

The method may further include: storing pixel rate data which is obtained by capturing an image of the component when the component is normally sucked by the nozzle prior to the component mounting operation; and correcting image data of the component in the image of the leading edge portion captured in the component mounting operation, by using the stored pixel rate data.

According to an aspect of another exemplary embodiment, there is provided a component mounting apparatus which may include: a nozzle supporting member on which a nozzle for sucking a component is installed; an optical system which is fixed on the nozzle supporting member for capturing simultaneously an image of an upper surface and a side surface of the component in a component mounting operation; and an analyzer which analyzes the image to determine whether a sucking state of the component sucked by the nozzle is normal or abnormal.

The upper surface of the component may be a sucking surface of the nozzle.

BRIEF DESCRIPTION OF THE DRAWINGS

The above and other aspects will become more apparent by describing in detail exemplary embodiments thereof with reference to the attached drawings, in which:

FIG. 2A shows a normal sucking state, FIG. 2B shows an abnormal sucking state, and FIG. 2C shows a component that is sucked, according to an exemplary embodiment;

FIGS. 5A and 5B are conceptual diagrams showing a variation of an image of an object (component) depending on a difference between pixel rates in a Z-axis direction according to an exemplary embodiment, wherein FIG. 5A shows an actual shape of the component and FIG. 5B shows a captured image;

FIGS. 7A and 7B are perspective views of a mounting apparatus according to an exemplary embodiment, wherein FIG. 7A shows a configuration of principal portions in the mounting apparatus and FIG. 7B shows a configuration around a nozzle supporting member in the mounting apparatus.

DETAILED DESCRIPTION OF THE EXEMPLARY EMBODIMENTS

Hereinafter, exemplary embodiments will be described in detail with reference to accompanying drawings.

Figures 1A, 1B, 1C, 1D:
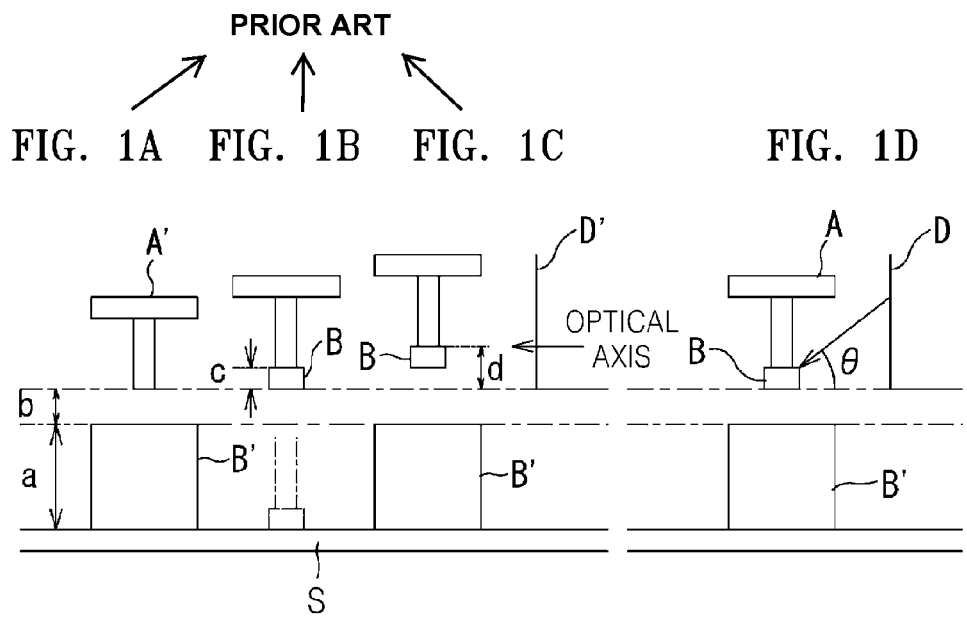
FIGS. 1A-1C illustrate operations of checking a state of a leading edge portion of a nozzle A' of a related-art mounting apparatus.
FIG. 1D illustrates an inventive concept of checking a leading edge portion of a state of a nozzle A of a mounting apparatus according to an exemplary embodiment.
Figure 1E:
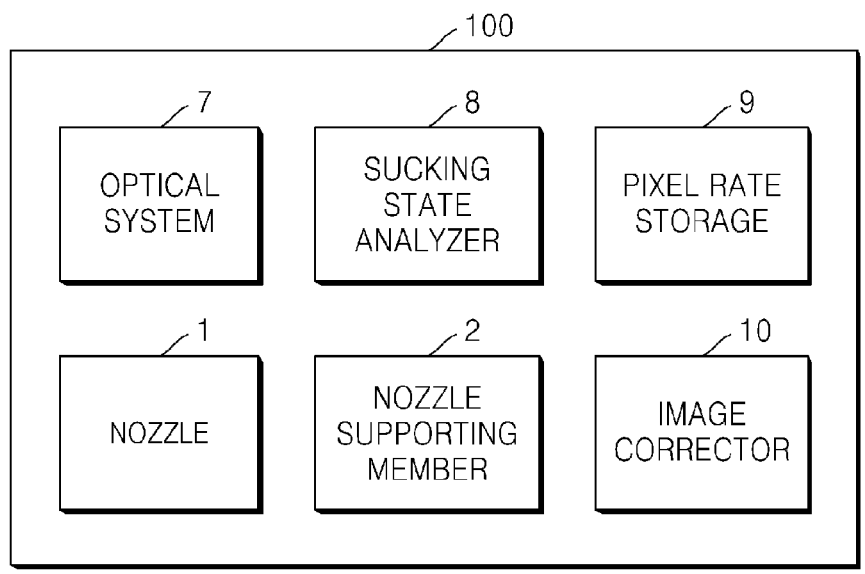
FIG. 1E is a block diagram illustrating major components of a mounting apparatus according to an exemplary embodiment.

FIGS. 1A-1C illustrate operations of checking a state of a leading edge portion of a nozzle A' of a related-art mounting apparatus. FIG. 1D illustrates an inventive concept of checking a leading edge portion of a state of a nozzle A of a mounting apparatus according to an exemplary embodiment. FIG. 1E is a block diagram illustrating major components of a mounting apparatus according to an exemplary embodiment.

As shown in FIG. 1A, when a component is not sucked by a nozzle A', a distance between a lower end surface of the nozzle A' and a surface of a substrate S may be "a+b" so that a state of the nozzle A' can be checked by an optical system D' of the related-art mounting apparatus having a horizontal optical axis as discussed earlier without being interfered by a component B' which is already mounted on the substrate S, where "a" denotes a maximum height of the component B' and "b" denotes a marginal distance (for example, about 1 to 2 mm) considering a variation of dimensions of the component B' or a bending of the substrate S.

As shown in FIG. 1B, when a component B is sucked by the nozzle A', the nozzle A' needs to be positioned at a height which is higher than a position of the nozzle A' in FIG. 1A by a thickness "c" of the component B, and a moving distance of the nozzle A' for mounting the component B on the substrate S is "a+b".

Next, in order to check a sucking state of the component B to the nozzle A', the optical system D' captures an image of the leading edge portion of the nozzle A'. Here, since an optical axis of the optical system D' is in a horizontal direction as shown in FIG. 1C, when a distance between the optical axis and the lower end of the optical system D' is d and the thickness c of the component B is less than the distance d (c<d), a height of the lower end of the optical system D' is a minimum height condition of the nozzle A' to avoid interference by the component B' in checking the sucking state of the component B.

In addition, the leading edge of the nozzle A' has to match the optical axis of the optical system D' in order to capture an image of the leading edge portion of the nozzle A', and thus, the nozzle A' needs to be ascended as much as a distance corresponding to "d−c" from the state shown in FIG. 1B. Then, the moving amount of the nozzle A' for mounting the component B on the substrate S is "a+b+(d−c)".

According to the present exemplary embodiment, as shown in FIG. 1D, an optical system D of a mounting apparatus performs a main photographing process for capturing an image of the component B in a state where the optical axis of the optical system D forms a predetermined angle $\theta$ with respect to a lower end surface, that is, a sucking surface of a nozzle A, not horizontally with the sucking surface of the nozzle A. Here, the predetermined angle $\theta$ is the same as an inclination angle of the optical axis of the optical system D. The optical system D may be installed on an upper portion in the mounting apparatus, and there is no limitation in locating the lower end of the optical system D. Therefore, as shown in FIG. 1D, the nozzle A may be disposed at a position, from which the moving amount for performing the mounting operation is "a+b", that is, the moving amount may be reduced as much as "d−c" from the moving amount of the related art shown in FIG. 1C. The distance "d−c" is in proportional to the inclination angle $\theta$ of the optical axis of the optical system D.

In the main photographing operation, the inclination angle $\theta$ of the optical axis of the optical system D may range from 4° to 40°. The reasons for this are explained later.

Figure 5A:
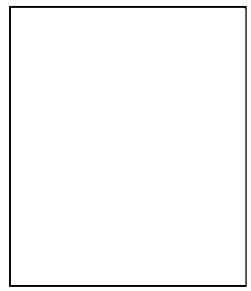
Figure 5A:
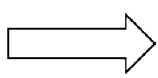

Referring to FIG. 1E, a mounting apparatus 100 according to an according to an exemplary embodiment includes at least a nozzle 1, a nozzle supporting member 2, an optical system 7, a sucking state analyzer 8, a pixel rate storage 9 and an image corrector 10. In reference to FIG. 1D, the nozzle 1 corresponds to the nozzle A, and the optical system 7 corresponds to the optical system D. The sucking state analyzer 8 analyzes an image of a leading edge portion of the nozzle 1 captured by the optical system 7 to analyze a sucking state of a component at the nozzle 1. As a result of the analysis, the sucking state analyzer 8 determines whether the sucking state is normal or abnormal. The operations of the pixel rate storage 9 and the image corrector 10 are explained later in reference to FIGS. 5A, 5B and 6.

A sucking state of a component on a nozzle is determined by capturing an image of a leading edge portion of the nozzle by using an optical system, and analyzing the captured image. There are various methods of analyzing the image in order to determine the sucking state; however, a method of comparing a height of the component of which an image is captured is provided according to an exemplary embodiment because of its simplicity and high accuracy.

Figure 2A:
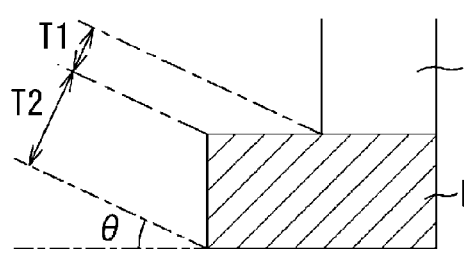
FIGS. 2A-2C are conceptual diagrams showing sucked states of a component on a nozzle, where
Figure 2B:
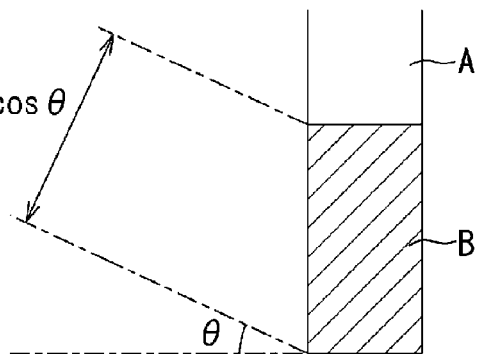

For example, while a sucking state shown in FIG. 2A is determined as a normal state and a sucking state shown in FIG. 2B is determined as an abnormal state, the sucking states are determined by comparing the height of the component B imaged by the optical system D.

Figure 2C:
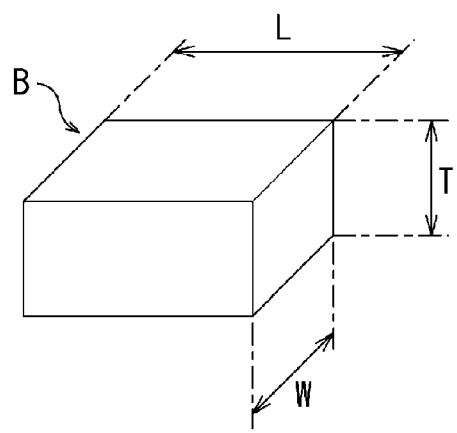

Here, a ceramic condenser that is a typical mounting component generally has a ratio between dimensions of L:W:T=2: 1:1, as shown in FIG. 2C, where L denotes a length, W denotes width, and T denotes a height. In addition, the nozzle is mainly fabricated to have a diameter of W=T=1. Under the above presumption, a photographed height of the component B in the normal sucking state shown in FIG. 2A is "T1+T2"="$\sin \theta + \cos \theta$", when the inclination angle of the optical axis is $\theta$. On the other hand, the height of the component B in the abnormal sucking state shown in FIG. 2B is "$2 \times \cos \theta$".

It is determined whether the sucking state is normal or abnormal by comparing the imaged height "$\sin \theta + \cos \theta$" of the component B in the normal sucking state with the imaged height "$2 \times \cos \theta$" of the component B in the abnormal sucking state. In addition, since a difference between "$\sin \theta + \cos \theta$" and "$2 \times \cos \theta$" is reduced as the angle $\theta$ increases from 0° and "$\sin \theta + \cos \theta$" is equal to "$2 \times \cos \theta$" when the angle $\theta$ becomes 45°, it may not be determined whether the sucking state is normal or abnormal according to the imaged height of the component B. Therefore, in this case, the inclination angle $\theta$ of the optical axis needs to be less than 45°, and may be 40° or less in consideration of variation in the dimensions of the component B.

Figure 3:
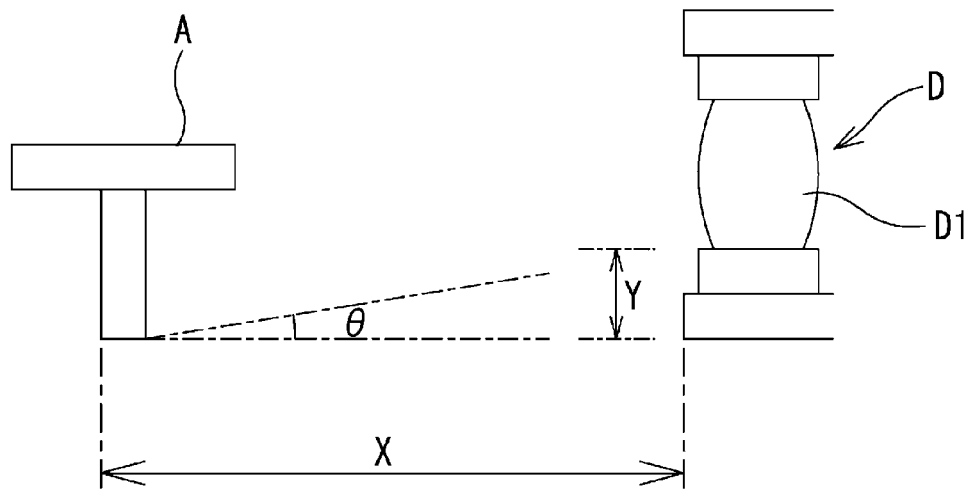
FIG. 3 is a conceptual diagram showing a relation between locations of the nozzle and an optical system, according to an exemplary embodiment.
Figure 4:
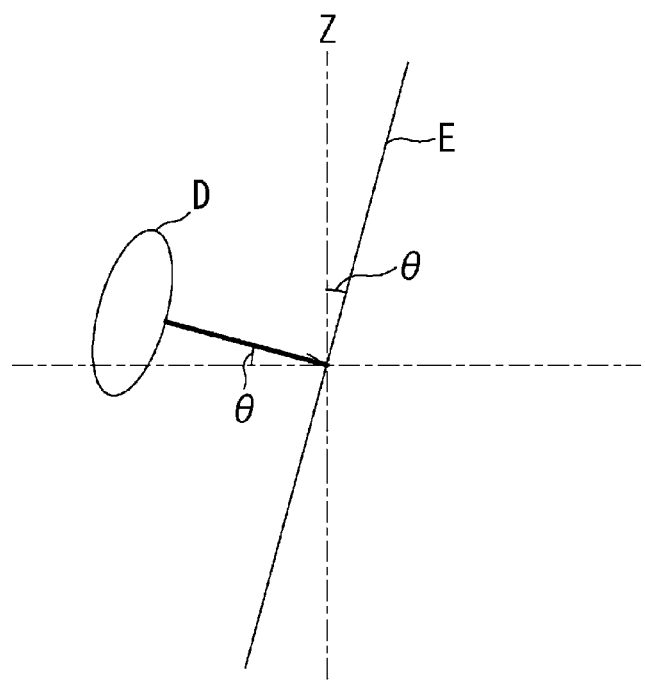
FIG. 4 is a conceptual diagram showing a relation between a focusing surface and a photographing target surface in an optical system, according to an exemplary embodiment.

On the other hand, the lowest limit of the inclination angle $\theta$ is decided by a structural configuration of a lower end of the optical system D. That is, as shown in FIG. 3, due to a structure of a lens D1 forming the optical system D, a distance Y between the lower end of the optical system D and an actual lower end of the lens D1 is at least about 2 mm. On the other hand, a distance X in which the nozzle A moves in the up-and-down direction without affecting the component sucking is at least about 30 mm. Therefore, the inclination angle $\theta$ of the optical axis of the optical system D may be at least about "$\tan^{-1}(2/30) = 3.8 \approx 4°$".

Figure 5B:
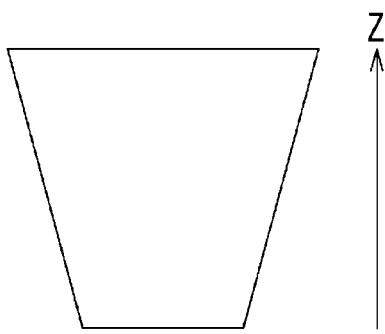

As described above, in the component mounting apparatus according to the present exemplary embodiment, the optical axis of the optical system D is inclined at a predetermined inclination angle $\theta$ with respect to the sucking surface of the nozzle A, that is, a horizontal surface. Thus, the captured image of the component B has a magnification varying depending on locations. For example, if the component B is a rectangular parallelepiped, a focusing surface E of the optical system D is deviated from a vertical surface in the Z-axis direction where a side surface (rectangle) of the rectangular parallelepiped is located as much as the inclination angle $\theta$, and thus, when the rectangle (FIG. 5A) located on the vertical surface is photographed by the optical system D, the rectangular shape is changed into a trapezoid (FIG. 5B). That is, the magnification is changed along the Z-axis direction. In addition, a pixel rate (μm/pixel) that is a dimension of one pixel on a photographing target surface is changed.

Figure 6:
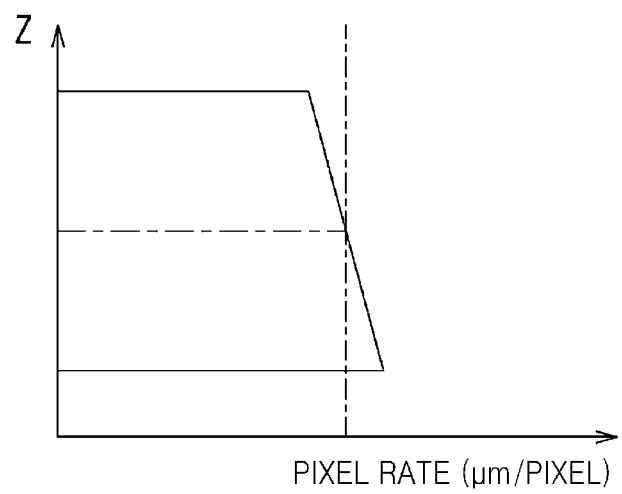
FIG. 6 is a conceptual diagram showing a variation in the pixel rate in the Z-axis direction according to an exemplary embodiment.

The pixel rate may be set as an average value in the Z-axis direction (dash-dot line of FIG. 6). However, since there are actually components having various heights, the actual pixel rate (solid line of FIG. 6) may be much less than the average value. In this case, since the actual pixel rate and the pixel rate that is used to calculate the height are different from each other, there may be an error in the measurement operation. When the sucking state of the component is determined, there may be an error in determining the shape of the component due to the above error in the measurement operation.

Therefore, according to the present exemplary embodiment, the component B that is normally sucked by the nozzle is photographed by the optical system 7 before a main photographing process to obtain actual pixel rate data (solid line of FIG. 6), and the pixel rate data is stored in the pixel rate storage (memory) 9 as shown in FIG. 1E. In addition, image data of the component B that is generated by the optical system 7 in the main photographing process is corrected by the image corrector 10 as shown in FIG. 1E by using the pixel rate data stored in the pixel rate storage 9. Accordingly, it may be determined accurately whether the sucking state of the component B is normal or abnormal. Here, the solid line in FIG. 6 is a straight line; however, it may not be a straight line.

Figure 7A:
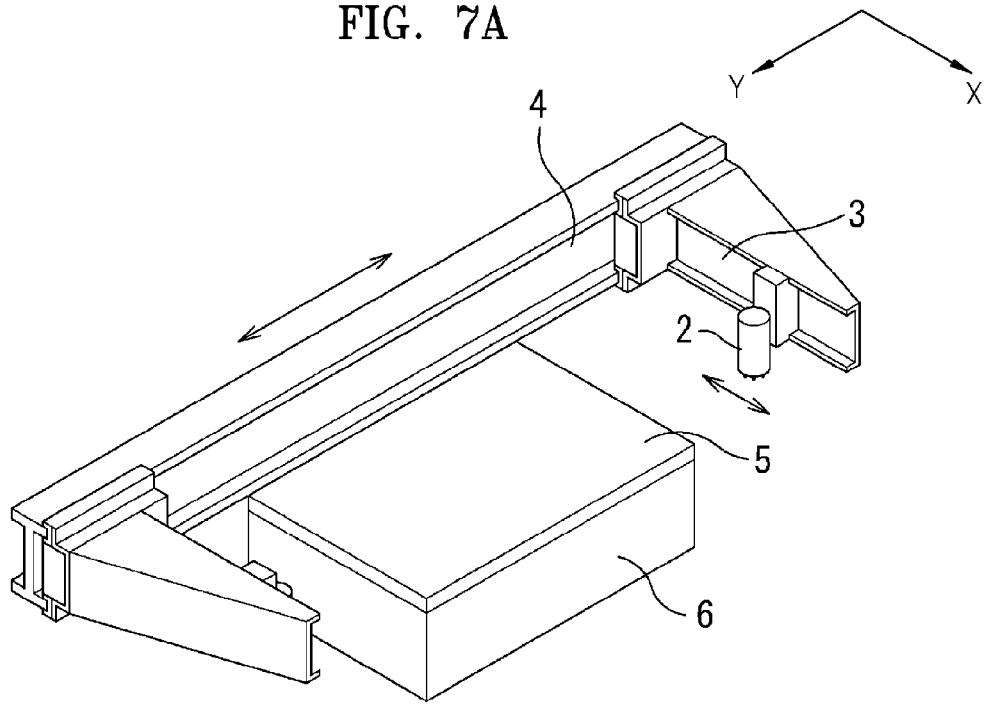
Figure 7B:
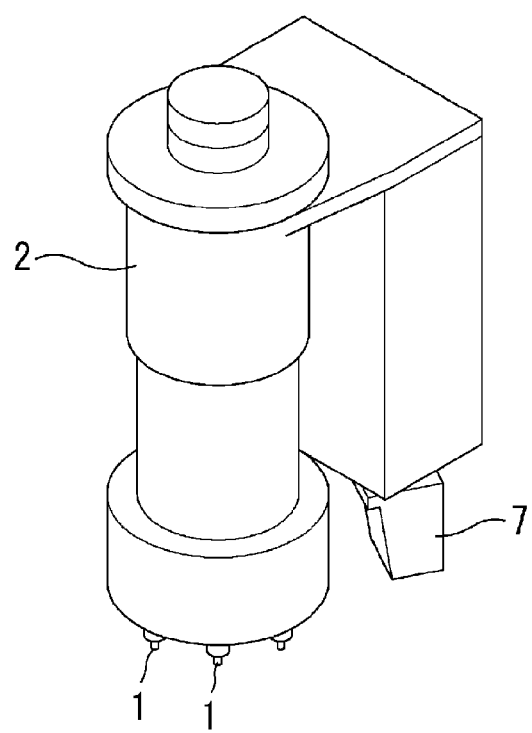

FIGS. 7A and 7B are perspective views showing a mounting apparatus according to an exemplary embodiment. That is, FIG. 7A shows a configuration of principal portions in the mounting apparatus, and FIG. 7B shows a structure around a nozzle supporting member 2 in the mounting apparatus according to the present exemplary embodiment.

A nozzle 1 for sucking a component is installed on the nozzle supporting member 2 to be movable in an up-and-down direction. In the present exemplary embodiment, a plurality of nozzles 1 are installed on a lower surface portion of the nozzle supporting member 2 in a circumferential direction.

The nozzle supporting member 2 may move along a guide rail 3 in an X-axis direction and a guide rail 4 in a Y-axis direction that are installed on a main body of the mounting apparatus, and freely moves in an X-Y direction on a horizontal surface. That is, in the mounting apparatus shown in FIGS. 7A and 7B, the nozzle supporting member 2 is relatively moved with respect to a substrate table 6 on which a substrate 5 is placed within a horizontal surface, and the nozzles 1 are moved in the up-and-down direction to mount the component sucked by the nozzles 1 on the substrate 5.

As shown in FIG. 7B, an optical system 7 is fixed on the nozzle supporting member 2. The optical system 7 captures an image of a leading edge portion of the nozzle 1. In addition, since the plurality of nozzles 1 are installed on the nozzle supporting member 2 and may be rotatable on the horizontal surface, an image of the leading edge portion of each of the nozzles 1 may be captured by the optical system 7.

Figure 8:
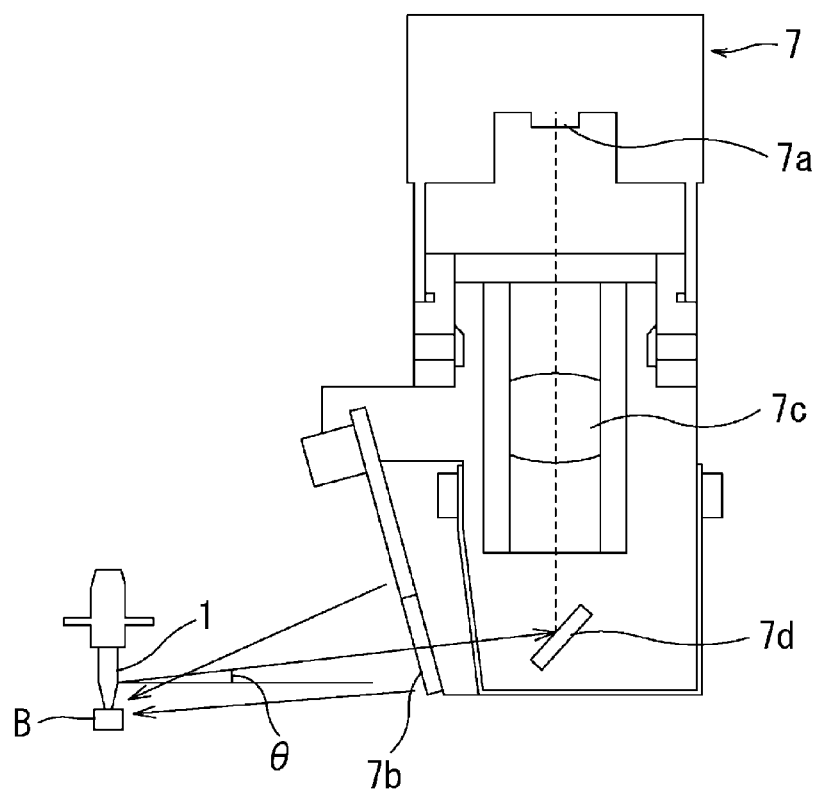
FIG. 8 is a view of an optical system according to an exemplary embodiment.

FIG. 8 is a view of the optical system 7 according to an exemplary embodiment.

The optical system 7 shown in FIG. 8 includes a charge-coupled device (CCD) sensor 7a, an illuminator 7b comprising a light emitting diode (LED), and a lens 7c and a reflective mirror 7d.

Illuminating light emitted from the illuminator 7b is reflected from the leading edge portion of the nozzle 1 that sucks the component B, and then is reflected by the reflective mirror 7*d*. After that, the reflected light reaches the CCD sensor 7*a* via the lens 7*c* and is recognized as an image.

In the mounting apparatus according to the present exemplary embodiment, the optical system 7 photographs the component B in a state where the optical axis of the optical system forms a predetermined angle θ with respect to the sucking surface of the nozzle 1 that sucks the component B, not in parallel with the sucking surface of the nozzle 1. In the present exemplary embodiment, the reflective mirror 7*d* is inclined at an angle of 3.5° from the horizontal surface such that the inclination angle θ of the optical axis is 7°.

According to an exemplary embodiment, the optical axis of an optical system is not in parallel with a sucking surface of a nozzle, but is inclined at a predetermined angle from the upper portion of the sucking surface. Thus, the optical system may be located higher than the optical system having an optical axis that is in parallel with the sucking surface of the nozzle, and accordingly interference between the lower end of the optical system and a component may be prevented easily. Therefore, the component may be photographed in a state where the nozzle is located on a lower portion of a mounting apparatus, and consequently the descending distance to the substrate, on which the component is to be mounted, after the photographing operation may be reduced. Thus, the moving distance of the nozzle in the up-and-down direction may be reduced. Accordingly, the mounting process may be performed at a high speed and the mounting accuracy may be improved.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A component mounting apparatus, comprising:
    a nozzle which sucks a component;
    a nozzle supporting member, on which the nozzle is installed, which moves in a vertical direction with respect to an upper surface of a substrate on which the component sucked at the nozzle is mounted;
    an optical system which captures an image of a leading edge portion of the nozzle where the component is sucked in a component mounting operation, from a side direction, such that an optical axis of the optical system is inclined at a predetermined angle with respect to a sucking surface of the nozzle;
    an analyzer which analyzes the image of the leading edge portion to determine whether a sucking state of the component sucked by the nozzle is normal or abnormal;
    a pixel rate storage which stores pixel rate data which is obtained by capturing an image of the component when the component is normally sucked prior to the component mounting operation, by the nozzle by using the optical system; and
    an image corrector which corrects image data of the component in the image of the leading edge portion captured in the component mounting operation, by using the pixel rate data stored in the pixel rate data storage.

2. The apparatus of claim 1, wherein the optical axis of the optical system is inclined at an angle predetermined between 4° and 40° upward with respect to the sucking surface of the nozzle, which is a horizontal surface.

3. The apparatus of claim 1, wherein the analyzer determines whether the sucking state is normal or abnormal by analyzing a height of the component determined from the image of the leading edge portion.

4. The apparatus of claim 3, wherein the optical axis of the optical system is inclined at a predetermined angle θ, and
    wherein the analyzer determines that the sucking state is normal if a vertical length of the component in the image of the leading edge portion is substantially equal to $T(\sin θ + \cos θ)$, where T is a thickness of the component.

5. The apparatus of claim 1, wherein the optical system illuminates light into the leading edge portion of the nozzle along the optical axis, and obtains the image of the leading edge portion by reflection of the light at the leading edge portion.

6. A component mounting apparatus comprising:
    a nozzle supporting member on which a nozzle for sucking a component is installed;
    an optical system which is fixed on the nozzle supporting member for capturing simultaneously an image of an upper surface and a side surface of the component in a component mounting operation;
    an analyzer which analyzes the image to determine whether a sucking state of the component sucked by the nozzle is normal or abnormal;
    a pixel rate storage which stores pixel rate data which is obtained by capturing an image of the component when the component is normally sucked prior to the component mounting operation, by the nozzle by using the optical system; and
    an image corrector which corrects image data of the component in the image of the leading edge portion captured in the component mounting operation, by using the pixel rate data stored in the pixel rate data storage.

7. The apparatus of claim 6, wherein the upper surface of the component is a sucking surface of the nozzle.

8. The apparatus of claim 6, wherein the analyzer determines whether the sucking state is normal or abnormal by analyzing a height of the component from the image of the upper surface and the side surface of the component.

9. The apparatus of claim 8, wherein the optical axis of the optical system is inclined at a predetermined angle θ, and
    wherein the analyzer determines that the sucking state is normal if a vertical length of the component in the image of the leading edge portion is substantially equal to $T(\sin θ + \cos θ)$, where T is a thickness of the component.

* * * * *